US012580582B2

(12) United States Patent
Perrott

(10) Patent No.: US 12,580,582 B2
(45) Date of Patent: Mar. 17, 2026

(54) DIGITAL-TO-TIME CONVERTER MISMATCH COMPENSATION

(71) Applicant: TEXAS INSTRUMENTS INCORPORATED, Dallas, TX (US)

(72) Inventor: Michael H. Perrott, Nashua, NH (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 17/899,430

(22) Filed: Aug. 30, 2022

(65) Prior Publication Data

US 2024/0072821 A1 Feb. 29, 2024

(51) Int. Cl.
*H03M 1/66* (2006.01)
*H03K 19/0185* (2006.01)
(Continued)

(52) U.S. Cl.
CPC .... *H03M 1/822* (2013.01); *H03K 19/018564* (2013.01); *H03M 1/802* (2013.01)

(58) Field of Classification Search
CPC .... H03M 1/0836; H03M 3/358; H03M 3/368; H03M 7/3004; H03M 1/002; H03M 1/0626; H03M 1/066; H03M 1/0665; H03M 1/0668; H03M 1/067; H03M 1/0687; H03M 1/0854; H03M 1/125; H03M 1/182; H03M 1/201; H03M 1/34; H03M 1/466; H03M 1/50; H03M 1/66; H03M 1/68; H03M 1/687; H03M 3/414;

H03M 3/43; H03M 3/456; H03M 7/3026; H03L 7/093; H03L 7/1976; H03L 7/085; H03L 7/0802; H03L 7/081; H03L 7/0814; H03L 2207/06;
(Continued)

(56) References Cited

U.S. PATENT DOCUMENTS 6,008,703 A * 12/1999 Perrott ................. H03C 3/0925
331/23
8,222,966 B2 * 7/2012 Ravi ........................ H03C 3/10
375/302
(Continued)

OTHER PUBLICATIONS

Korean International Searching Authority, International Search Report, mailed Dec. 12, 2023, 4 pages.
(Continued)

*Primary Examiner* — Linh V Nguyen
(74) *Attorney, Agent, or Firm* — Zhenhai Fu; Frank D. Cimino

(57) ABSTRACT

A digital-to-time converter circuit includes a scrambling and noise shaping circuit, a digital-to-analog converter (DAC), and a buffer circuit. The scrambling and noise shaping circuit includes an input and an output. The input is coupled to a delay input terminal. The scrambling and noise shaping circuit is configured to generate a residue value signal that scrambles and noise shapes a mismatch error. The DAC includes an input and an output. The input of the DAC is coupled to the output of the scrambling and noise shaping circuit. The DAC is configured to generate a residue timing signal based on the residue value signal that scrambles and noise shapes the mismatch error. The buffer circuit includes an input and an output. The input of the buffer circuit is coupled to the output of the DAC. The output of the buffer circuit is coupled to a signal output terminal.

30 Claims, 9 Drawing Sheets

(51) Int. Cl.
    *H03M 1/80*       (2006.01)
    *H03M 1/82*       (2006.01)

(58) Field of Classification Search
    CPC ......... H03L 2207/50; H03L 7/04; H03L 7/08;
             H03L 7/0805; H03L 7/0807; H03L
             7/0816; H03L 7/087; H03L 7/0893; H03L
             7/0895; H03L 7/091; H03L 7/097; H03L
             7/099; H03L 7/0991; H03L 7/0992; H03L
             7/0995; H03L 7/1072; H03L 7/18; H03L
             7/187; H03L 7/1978
    USPC ........................................ 341/143, 144, 150
    See application file for complete search history.

(56)              References Cited

U.S. PATENT DOCUMENTS

| | | | | |
|---|---|---|---|---|
| 8,497,716 | B2 * | 7/2013 | Zhang .................. | H03L 7/1976 |
| | | | | 327/147 |
| 8,860,514 | B2 * | 10/2014 | Weltin-Wu ........... | H03K 5/131 |
| | | | | 331/74 |
| 8,976,053 | B1 * | 3/2015 | Zhang .................. | G04F 10/005 |
| | | | | 341/155 |
| 9,209,958 | B1 * | 12/2015 | Palaskas .............. | G04F 10/005 |
| 9,350,527 | B1 * | 5/2016 | Masuda ................ | H04L 7/0041 |
| 9,362,936 | B1 | 6/2016 | Caffee | |
| 9,678,481 | B1 * | 6/2017 | Gao .................... | H03M 1/1009 |
| 9,722,537 | B2 | 8/2017 | Vlachogiannakis | |
| 10,177,774 | B2 * | 1/2019 | Palaskas .............. | H03M 1/466 |
| 10,606,217 | B2 * | 3/2020 | Kim .......................... | H03L 7/18 |
| 10,895,850 | B1 * | 1/2021 | Elkholy ............... | G04F 10/005 |
| 11,626,883 | B2 * | 4/2023 | Wu ..................... | H03M 1/0607 |
| | | | | 341/144 |
| 2013/0028448 | A1 * | 1/2013 | Choi .................... | H03F 3/2173 |
| | | | | 381/120 |
| 2013/0033293 | A1 * | 2/2013 | Zhang .................. | H03L 7/1976 |
| | | | | 327/156 |
| 2014/0002288 | A1 * | 1/2014 | Scholz ................. | G04F 10/005 |
| | | | | 341/144 |
| 2014/0176201 | A1 * | 6/2014 | Weltin-Wu ........... | H03K 5/131 |
| | | | | 327/115 |
| 2015/0036767 | A1 * | 2/2015 | Degani ................ | H03F 3/2175 |
| | | | | 375/298 |
| 2015/0145571 | A1 * | 5/2015 | Perrott ................. | G04F 10/005 |
| | | | | 327/551 |
| 2016/0182072 | A1 * | 6/2016 | Preyler .................. | H03M 3/33 |
| | | | | 341/200 |
| 2016/0337050 | A1 * | 11/2016 | Melester ............... | H04B 17/12 |
| 2017/0364034 | A1 | 12/2017 | Gao | |
| 2019/0115926 | A1 * | 4/2019 | Ximenes .............. | H03L 7/0992 |
| 2020/0028519 | A1 * | 1/2020 | Hsiao .................. | H03M 1/067 |
| 2022/0190833 | A1 | 6/2022 | Moslehi Bajestan | |

OTHER PUBLICATIONS

Korean International Searching Authority, Written Opinion, mailed
Dec. 12, 2023, 4 pages.

\* cited by examiner

DIGITAL-TO-TIME CONVERTER MISMATCH COMPENSATION

BACKGROUND

Frequency synthesizers use fractional-N phase-locked loops (PLLs) to generate output frequencies that are non-integer multiples of a reference frequency. To reduce output dock jitter, the fractional-N PLL may include a digital-to-time converter circuit. The digital-to-time converter (DTC) circuit is a variable delay circuit that delays a received signal by a time defined by a digital delay value. In a fractional-N PLL, a digital-to-time converter circuit can reduce output jitter by adjusting the edge timing of one or more edge signals fed to the phase detector of the PLL.

SUMMARY

In one example, a digital-to-time converter circuit includes a delay input terminal, a signal output terminal, a delta-sigma modulator circuit, a dynamic element matching (DEM) circuit, a thermometer digital-to-analog converter (DAC), and a buffer circuit. The delta-sigma modulator circuit includes an input and an output. The input of the delta-sigma modulator circuit is coupled to the delay input terminal of the digital-to-time converter circuit. The DEM circuit includes an input and an output. The input of the DEM circuit is coupled to the output of the delta-sigma modulator circuit. The thermometer DAC includes an input and an output. The input of the thermometer DAC is coupled to the output of the DEM circuit. The buffer circuit includes an input and an output. The input of the buffer circuit is coupled to the output of the thermometer DAC. The output of the buffer circuit is coupled to the signal output terminal of the digital-to-time converter circuit.

In another example, a digital-to-time converter circuit includes a delay input terminal, a signal output terminal, a scrambling and noise shaping circuit, a DAC, and a buffer circuit. The scrambling and noise shaping circuit includes an input and an output. The input of the scrambling and noise shaping circuit is coupled to the delay input terminal of the digital-to-time converter circuit. The scrambling and noise shaping circuit is configured to generate a residue value signal that scrambles and noise shapes a mismatch error. The DAC includes an input and an output. The input of the DAC is coupled to the output of the scrambling and noise shaping circuit. The DAC is configured to generate a residue timing signal based on the residue value signal that scrambles and noise shapes the mismatch error. The buffer circuit includes an input and an output. The input of the buffer circuit is coupled to the output of the DAC. The output of the buffer circuit is coupled to the signal output terminal of the digital-to-time converter circuit.

In a further example, a phase-locked loop (PLL) circuit includes a phase detector circuit, a filter circuit, a voltage-controlled oscillator (VCO), a divider circuit, a delta-sigma modulator circuit, and a digital-to-time converter circuit. The filter circuit is coupled to the phase detector circuit. The VCO is coupled to the filter circuit. The divider circuit is coupled to the VCO. The delta-sigma modulator circuit is coupled to the divider circuit. The digital-to-time converter circuit is coupled to the delta-sigma modulator circuit and the phase detector circuit. The digital-to-time converter circuit includes a scrambling and noise shaping circuit, a DAC, and a buffer circuit. The scrambling and noise shaping circuit includes an input and an output. The input of the scrambling and noise shaping circuit is coupled to the delta-sigma modulator circuit. The scrambling and noise shaping circuit is configured to generate a residue value signal that scrambles and noise shapes a mismatch error. The DAC includes an input and an output. The input of the DAC is coupled to the output of the scrambling and noise shaping circuit. The DAC is configured to generate a residue timing signal based on the residue value signal that scrambles and noise shapes the mismatch error. The buffer circuit includes an input and an output. The input of the buffer circuit is coupled to the output of the DAC. The output of the buffer circuit is coupled to the phase detector circuit.

DETAILED DESCRIPTION

Figure 1A:
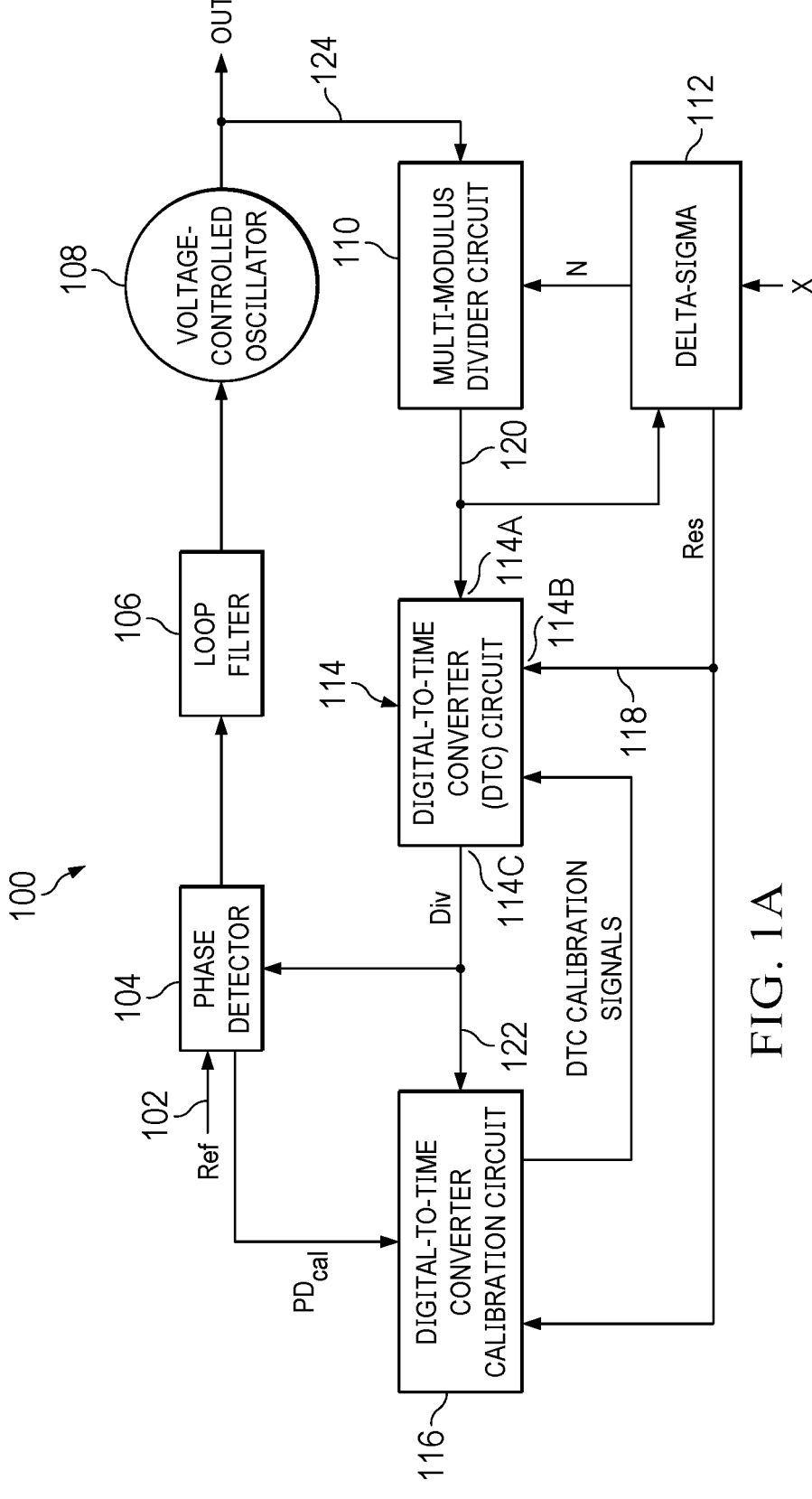
FIG. 1A is a block diagram of an example fractional-N synthesizer that includes a digital-to-time converter with reduced mismatch error coupled to a divider output.

Digital-to-time converter circuits are subject to a number of error conditions that affect the delay applied to a received clock signal. For example, a digital-to-time converter circuit that provides delay based on an RC (resistor-capacitor) time constant is subject to gain error, integral nonlinearity (INL) error, and mismatch error. Gain error (error between desired vs actual maximum delay value minus minimum delay value as controlled by the delay input to the digital-to-time converter circuit) is caused by variation in the range of the RC time constant across process, voltage, and temperature variations (PVT). INL error is caused, in large part, by the change in slope of input to a buffer (e.g., an output buffer) of the digital-to-time converter as a function of the delay input value. INL due to the change in slope to the buffer tends to be quadratic in nature with a peak value that changes with PVT. Mismatch error is caused by differences (mismatch) in the capacitors of a capacitive digital-to-analog converter (DAC), or differences (mismatch) of current elements of a current DAC, of the digital-to-time converter circuit. Mismatch error is generally random in nature and varies with PVT.

The delay input values provided to the digital-to-time converter represent a residue value signal generated by a delta-sigma modulator. The delta-sigma modulator also generates divider values for a multi-modulus frequency divider, and the residue value signal generated by the delta-sigma modulator is predictive of the instantaneous timing error at the output of the multi-modulus frequency divider caused by variations of the divider values. The digital-to-time converter ideally cancels the instantaneous timing error according to the residue value signal, but such cancellation may be degraded by the digital-to-time converter error sources. The residue value signal output by the delta-sigma modulator tends to have periodic components, which leads to periodic patterns in digital-to-time converter mismatch error such that fractional spurs are produced. Achievement of low fractional spurs is an important requirement for many applications.

In some digital-to-time converter circuits, mismatch error compensation may be provided by including a look-up table that controls an auxiliary set of elements (e.g., auxiliary capacitors of a capacitive DAC) to address code gaps and other non-idealities caused by mismatch. However, generating the look-up table entries generally requires time consuming measurements that increase production cost, and the compensation provided by the look-up table may degrade with variations in temperature or voltage.

The digital-to-time converters described herein apply scrambling and noise shaping to compensate for mismatch in the digital-to-time converter. The scrambling randomizes the mapping from residue value signal to mismatch error in order to avoid periodicity and thereby reduce fractional spurs. The noise shaping reduces the impact of mismatch error by shifting mismatch related noise to higher frequencies that are, in turn, low-pass filtered by the PLL. The digital-to-time converters may implement the scrambling and noise shaping by using one or more delta-sigma modulators to noise shape the quantization noise and scramble the mismatch error and applying dynamic element matching to shift mismatch related noise to higher frequencies (i.e., noise shape the mismatch error).

FIG. 1A is a block diagram for an example fractional-N synthesizer 100 that applies scrambling and noise shaping to reduce mismatch error of the digital-to-time converter. The fractional-N synthesizer 100 includes a phase detector 104, a loop filter 106, a voltage-controlled oscillator 108, a multi-modulus divider circuit 110, a delta-sigma modulator circuit 112, a digital-to-time converter circuit 114, and a digital-to-time converter calibration circuit 116 arranged as a PLL circuit. The phase detector 104 is coupled to a reference terminal 102, the loop filter 106 and the digital-to-time converter circuit 114. The phase detector 104 compares a reference signal (Ref) received at the reference terminal 102 and the output (Div) of the digital-to-time converter circuit 114 to generate a difference signal representing the phase difference of Ref and Div.

The loop filter 106 is coupled to the voltage-controlled oscillator 108. The loop filter 106 low-pass filters the difference signal generated by the phase detector 104, and the output of the loop filter 106 controls the voltage-controlled oscillator 108. The voltage-controlled oscillator 108 is coupled to the multi-modulus divider circuit 110. The multi-modulus divider circuit 110 divides the frequency of output (Out) of the voltage-controlled oscillator 108. The multi-modulus divider circuit 110 is coupled to the delta-sigma modulator circuit 112 and the digital-to-time converter circuit 114. The divisor (N) applied by the multi-modulus divider circuit 110 to divide the frequency of Out is generated by the delta-sigma modulator circuit 112. The delta-sigma modulator circuit 112 generates the divisor N based on a fractional value (X).

As the divisor N changes, the timing of the edges of the signal 120 produced by the multi-modulus divider circuit 110 changes relative to the edges of Ref. The digital-to-time converter circuit 114 is coupled to the delta-sigma modulator circuit 112. The digital-to-time converter circuit 114 reduces the variation in edge timing of the signal 120 by delaying an edge of the signal 120 based on a residue value signal (Res) received from the delta-sigma modulator circuit 112 to produce Div.

The digital-to-time converter calibration circuit 116 is coupled to the phase detector 104, the delta-sigma modulator circuit 112, and the digital-to-time converter circuit 114. The digital-to-time converter calibration circuit 116 generates calibration signals (DTC calibration signals) that compensate for gain error and INL in the digital-to-time converter circuit 114. Additional information on gain error and INL error compensation can be found in U.S. patent application Ser. No. 17/573,323.

Figure 1B:
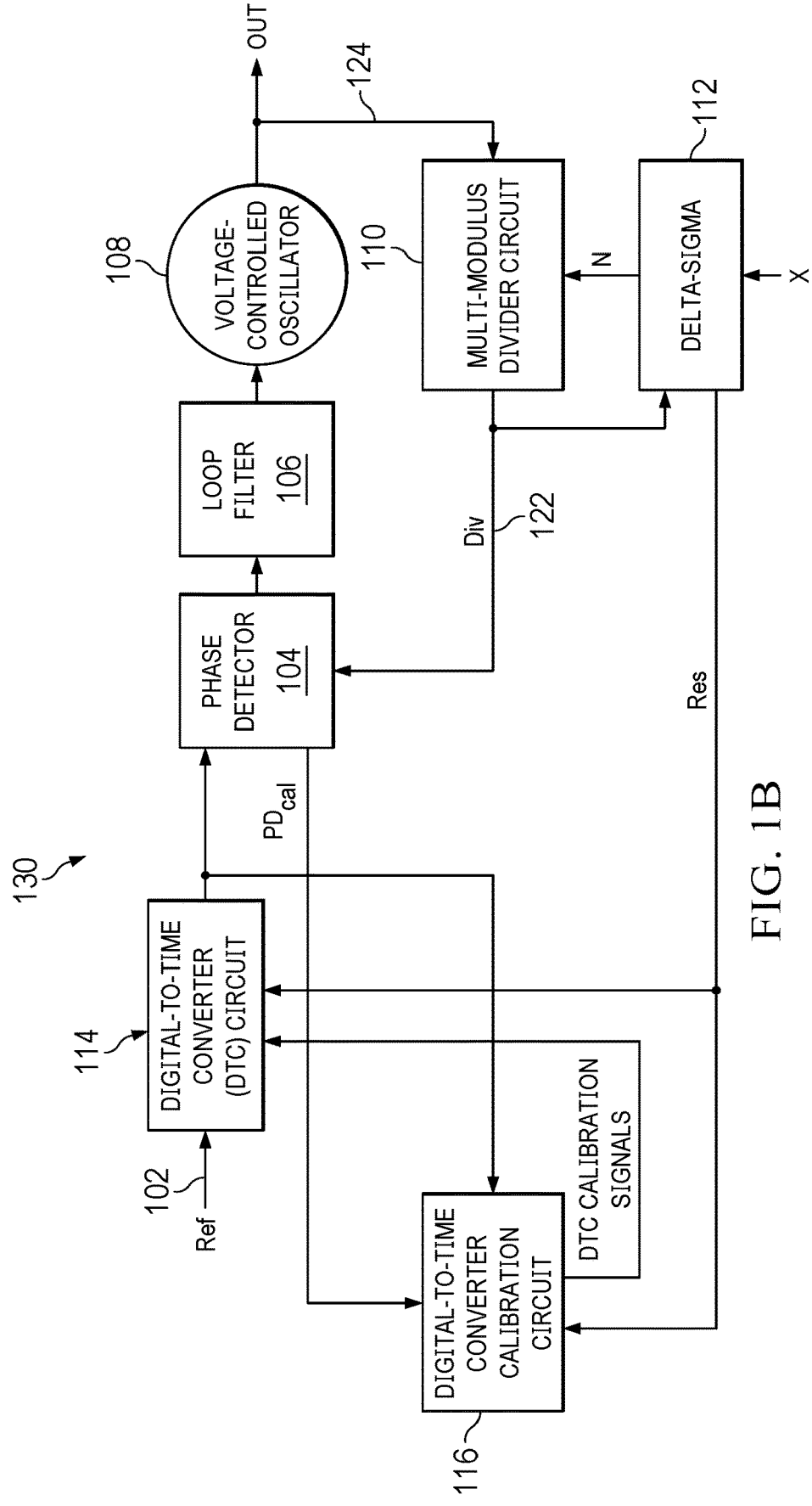
FIG. 1B is a block diagram of an example fractional-N synthesizer that includes a digital-to-time converter with reduced mismatch error coupled to a reference input.

FIG. 1B is a block diagram of a second example fractional-N synthesizer 130. The fractional-N synthesizer 130 is similar to the fractional-N synthesizer 100, except the digital-to-time converter circuit 114 is coupled between the reference terminal 102 and the phase detector 104, rather than between the 110 and the phase detector 104 as in the fractional-N synthesizer 100.

Figure 1C:
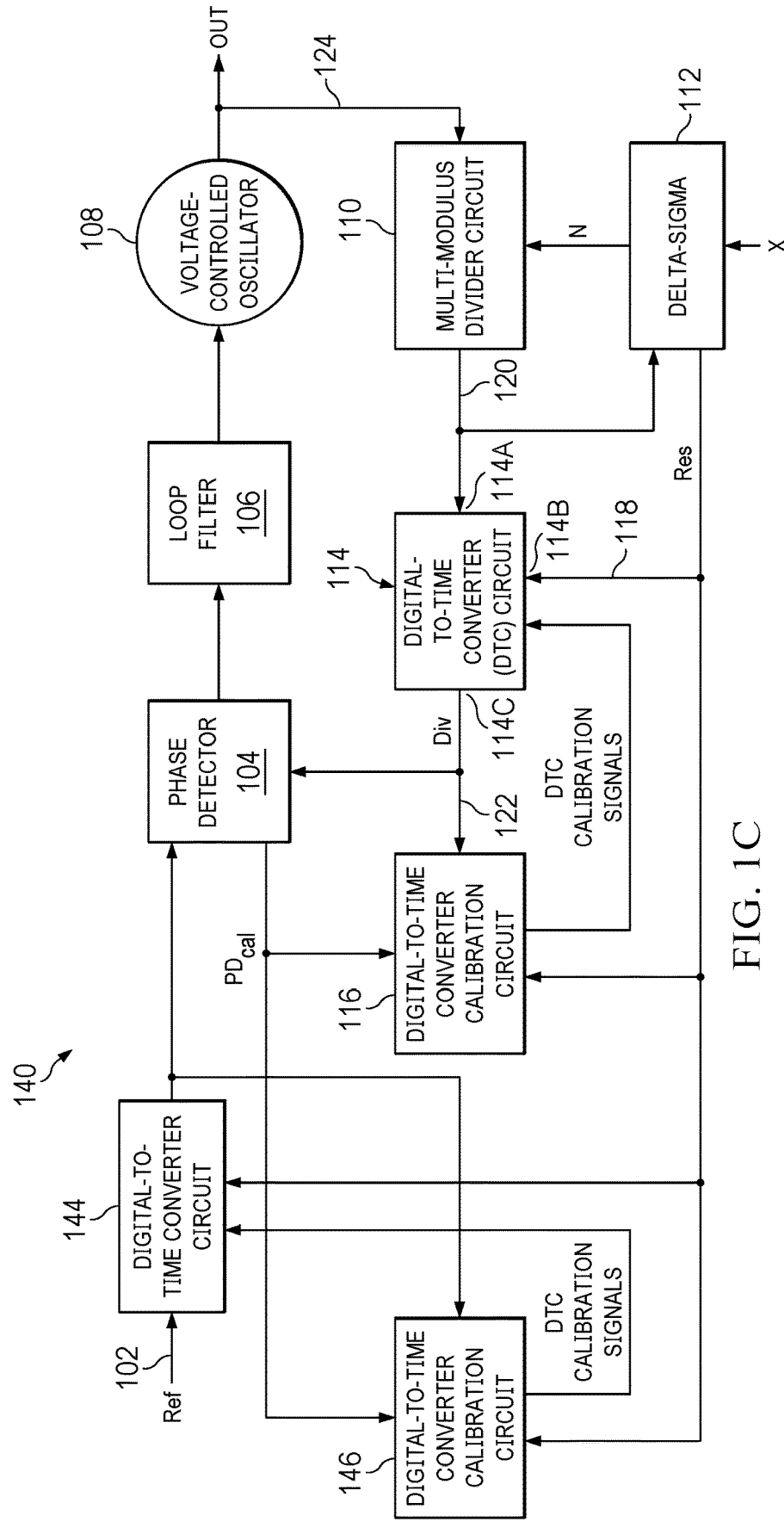
FIG. 1C is a block diagram of an example fractional-N synthesizer that includes a first digital-to-time converter with reduced mismatch error coupled the divider output and a second digital-to-time converter with reduced mismatch error coupled to the reference input.

FIG. 1C is a block diagram of a third example fractional-N synthesizer 140. The fractional-N synthesizer 140 includes the digital-to-time converter circuit 114 coupled between the 110 and the phase detector 104 as in the fractional-N synthesizer 100, and includes a second digital-to-time converter circuit 144 coupled between the reference terminal 102 and the phase detector 104 as in the fractional-N synthesizer 130. The digital-to-time converter circuit 144 may be similar or identical to the digital-to-time converter circuit 114. The fractional-N synthesizer 140 also includes a second digital-to-time converter calibration circuit 146 coupled to the digital-to-time converter circuit 144. The digital-to-time converter calibration circuit 146 may be similar or identical to the digital-to-time converter calibration circuit 116.

Figure 2:
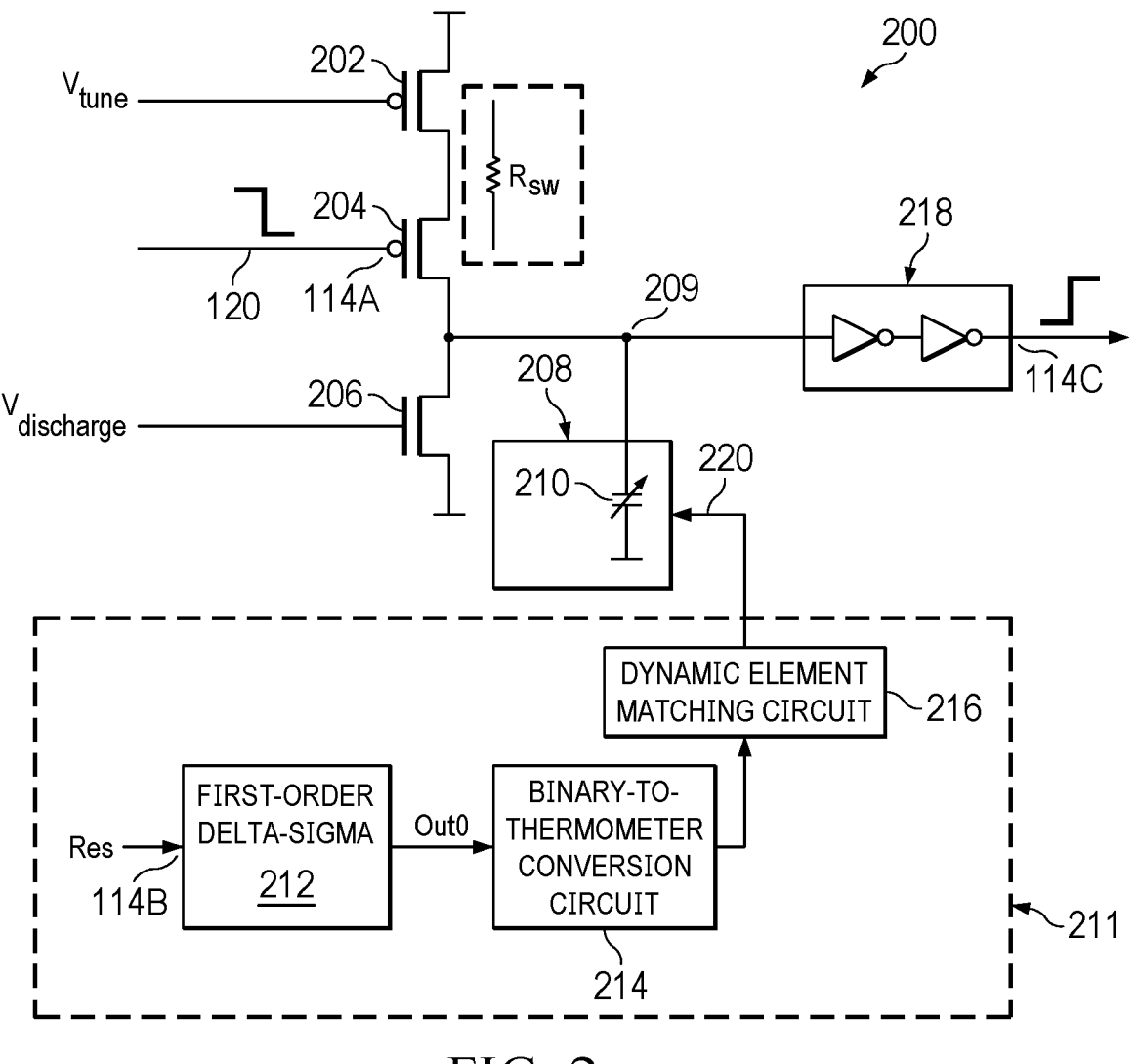
FIG. 2 is a block diagram for a first example digital-to-time converter with reduced mismatch error.

To compensate for mismatch error in the various elements of the digital-to-time converter circuit 114 that generate the delay applied to the signal 120, the digital-to-time converter circuit 114 includes scrambling and noise shaping circuitry. FIG. 2 is a block diagram for an example digital-to-time converter circuit 200 that includes scrambling and noise shaping circuitry to reduce the impact of mismatch error. The digital-to-time converter circuit 200 includes a transistor 202, a transistor 204, a transistor 206, a thermometer DAC 208, a scrambling and noise shaping circuit 211, and a buffer 218. In the digital-to-time converter circuit 200, the signal 120 received at the signal input terminal 114A is delayed by a time needed to charge the capacitor array 210 within the thermometer DAC 208 (through the transistor 202 and the transistor 204) to the threshold of the buffer 218. The transistors 202 and 204 provide the resistance $R_{SW}$ for conducting current to the thermometer DAC 208. The transistor 202 is controlled by calibration signal ($V_{tune}$) received from the digital-to-time converter calibration circuit 116 to adjust the range of the digital-to-time converter circuit 200 so that gain error is minimized. The transistor 204 is controlled by the signal 120 received from the multi-modulus divider circuit 110 (or by Ref in the fractional-N synthesizer 130 or 140). The gate of the transistor 204 is coupled to the signal input terminal 114A. Current flows through the transistor 202 and the transistor 204 to charge the capacitor array 210 within thermometer DAC 208. When the voltage across the thermometer DAC 208, node 209, exceeds the threshold of the buffer 218, the buffer 218 changes state, and generates an edge at the signal output terminal 114C. The buffer 218 includes an output coupled to the signal output terminal 114C. The transistor 206 discharges the thermometer DAC 208 such that the ramp in voltage on node 209 consistently starts from a given reset voltage. Control of $V_{discharge}$ is achieved with auxiliary control circuits (not shown) that typically assert $V_{discharge}$ (begin discharge of node 209) upon sensing the rising edge of buffer 218 and then de-assert $V_{discharge}$ before the falling edge of signal 120. The transistor 202 and the transistor 204 may be p-channel field effect transistors (FETs). The transistor 206 may be an n-channel FET.

The thermometer DAC 208 is coupled to the transistor 204, the transistor 206, and the buffer 218. The thermometer DAC 208 is a thermometer DAC and includes capacitor array 210 consisting of N unit capacitors, where N may be >100 and, for high performance applications, may be >1000. The values of the unit capacitors within capacitor array 210 may vary (with respect to one another), and such variance is referred to as mismatch. Typically, unit capacitor values may be <=1 fF when implementing the digital-to-time converter in modern CMOS processes. Each of the unit capacitors of the capacitor array 210 is individually selectable for connection to the transistor 204 and the buffer 218 by switches of the thermometer DAC 208 (not shown).

The scrambling and noise shaping circuit 211 selects the particular unit capacitors within capacitor array 210 to be switchably connected to the transistor 204 and the buffer 218 for each edge processed by the digital-to-time converter circuit 200. The scrambling and noise shaping circuit 211 randomizes selection of the unit capacitors of the capacitor array 210 to reduce fractional spurs and shift mismatch related noise to higher frequencies. The scrambling and noise shaping circuit 211 includes a delta-sigma modulator circuit 212, a binary-to-thermometer conversion circuit 214, and a dynamic element matching circuit 216. The delta-sigma modulator circuit 212 may be a first-order delta-sigma modulator. The delta-sigma modulator circuit 212 is coupled to the delay input terminal 114B for receipt of the residue value signal (Res) generated by the delta-sigma modulator circuit 112. An output of the delta-sigma modulator circuit 212 is coupled to an input of the binary-to-thermometer conversion circuit 214. An output of the binary-to-thermometer conversion circuit 214 is coupled to an input of the dynamic element matching circuit 216. An output of the dynamic element matching circuit 216 is coupled to an input of the thermometer DAC 208. The delta-sigma modulator circuit 212 generates a binary output (Out0) based on Res (and the internal state of the delta-sigma modulator circuit 212). The binary-to-thermometer conversion circuit 214 converts Out0 to a thermometer code. For example, in the output of the binary-to-thermometer conversion circuit 214 a number of bits corresponding to the binary value Out0 are set. The dynamic element matching circuit 216 receives the thermometer code generated by the binary-to-thermometer conversion circuit 214 and generates a new thermometer code 220 for application in the thermometer DAC 208. The new thermometer code 220 selects the same number of control bits for the capacitor array 210 (includes the same number of set bits) as the thermometer code received from the binary-to-thermometer conversion circuit 214, but the bits set in the new thermometer code 220 may be different from the bits set in the output of the binary-to-thermometer conversion circuit 214. For example, the dynamic element matching circuit 216 may implement barrel shifting, or other DEM algorithm, to select the bit values of the new thermometer code 220.

The delta-sigma modulator circuit 212 truncates Res to produce Out0, where it is assumed that Res may include a higher number of bits than Out0, such that the quantization noise due to truncation is noise shaped. The resulting dithering in Out0 due to truncation also aids in scrambling the mismatch error due to mismatch of the unit capacitors of the capacitor array 210 relative to Res received at the delay input terminal 114B. The mismatch error due to mismatch of the unit capacitors of the capacitor array 210 is shaped (moved to higher frequencies) by operation of the dynamic element matching circuit 216 and filtered by the PLL.

Figure 3:
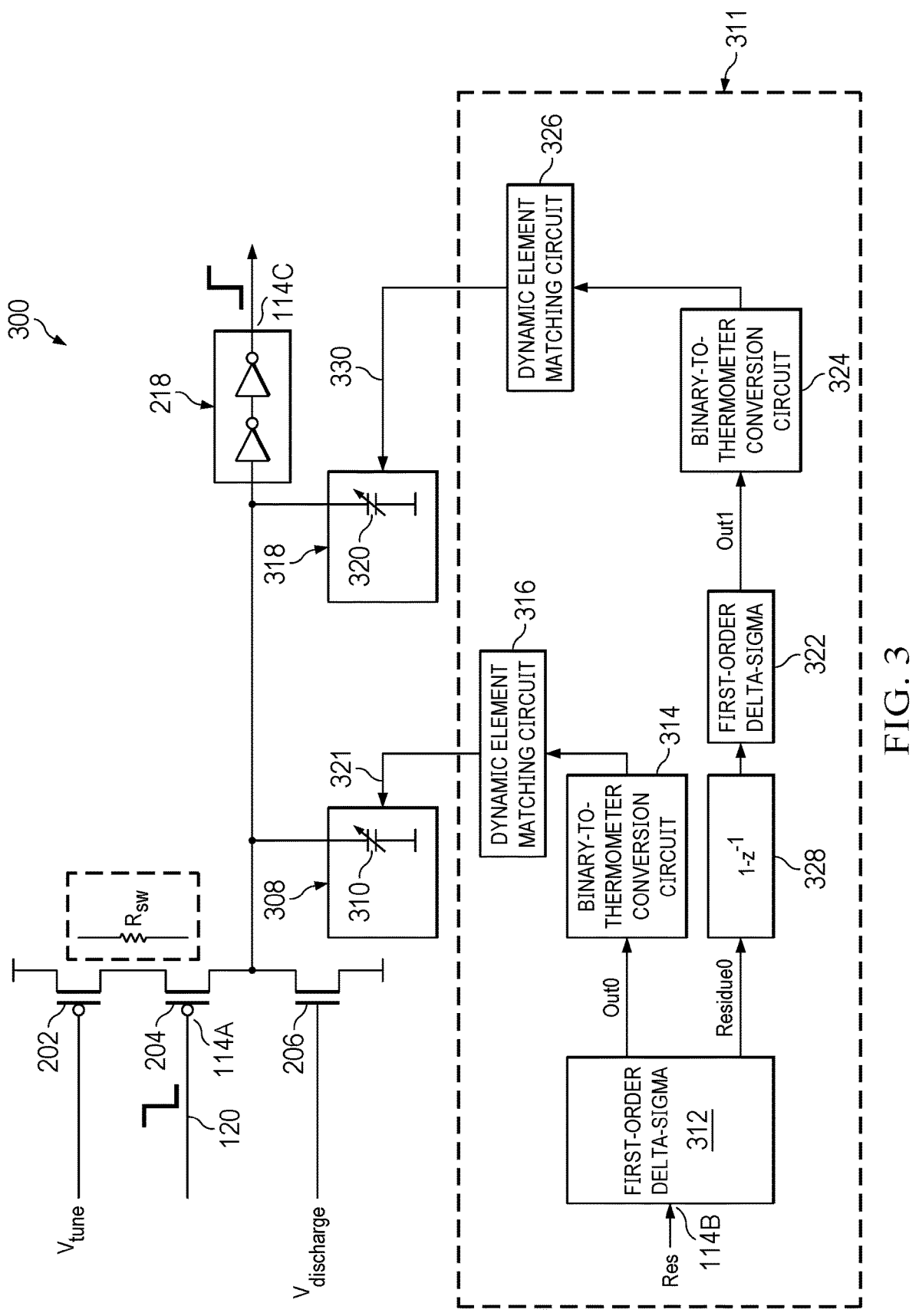
FIG. 3 is a block diagram for a second example digital-to-time converter with reduced mismatch error.

FIG. 3 is a block diagram for an example digital-to-time converter circuit 300 that includes scrambling and noise shaping circuitry to reduce mismatch error. The digital-to-time converter circuit 300 is similar to the digital-to-time converter circuit 200, but with reduced complexity for the DEM implementation. Rather than a single thermometer DAC 208 as in the digital-to-time converter circuit 200, the digital-to-time converter circuit 300 includes a thermometer DAC 308 and a thermometer DAC 318 coupled to the transistor 204 and the buffer 218. The thermometer DAC 308 includes an array of (N) capacitors 310, and the thermometer DAC 318 includes an array of (M) capacitors 320. Each capacitor 320 has a capacitance equal to a selected unit capacitance UnitCapacitance. Each capacitor 310 has a capacitance equal to M/2*UnitCapacitance. The number of control bits in the thermometer DAC 308 and the thermometer DAC 318 is substantially lower than the number of control bits in the thermometer DAC 208. For example, if the thermometer DAC 208 includes 128 control bits for unit capacitors of the capacitor array 210, the thermometer DAC 308 may include 16 control bits for capacitors 310 and the thermometer DAC 318 may include 16 control bits for capacitors 320.

The scrambling and noise shaping circuit 311 selects the particular capacitors 310 and capacitors 320 to be switchably connected to the transistor 204 and the buffer 218 for each edge processed by the digital-to-time converter circuit 300. The scrambling and noise shaping circuit 311 randomizes selection of the capacitors 310 and the capacitors 320 to reduce fractional spurs and shift mismatch related noise to higher frequencies. The scrambling and noise shaping circuit 311 includes the delta-sigma modulator circuit 312, a binary-to-thermometer conversion circuit 314, and a dynamic element matching circuit 316. An output of the delta-sigma modulator circuit 312 is coupled to an input of the binary-to-thermometer conversion circuit 314. An output of the binary-to-thermometer conversion circuit 314 is coupled to an input of the dynamic element matching circuit 316. An output of the dynamic element matching circuit 316 is coupled to an input of the thermometer DAC 308 (i.e., control bits for capacitors 310). The delta-sigma modulator circuit 312 generates a binary output (Out0) based on Res (and the internal state of the delta-sigma modulator circuit 312). The binary code Out0 generated by delta-sigma modulator circuit 312 may include fewer bits than the binary code Out0 generated by delta-sigma modulator circuit 212. The binary-to-thermometer conversion circuit 314 converts Out0 to a thermometer code. The thermometer code generated by the binary-to-thermometer conversion circuit 314 may include fewer bits than the thermometer code generated by the binary-to-thermometer conversion circuit 214. The dynamic element matching circuit 316 receives the thermometer code generated by the binary-to-thermometer conversion circuit 314 and generates a new thermometer code 321 for application in the thermometer DAC 308. The new thermometer code 321 selects the same number of control bits for capacitors 310 (includes the same number of set bits) as the thermometer code received from the binary-to-thermometer conversion circuit 314, but the bits set in the new thermometer code 321 may be different from the bits set in the output of the binary-to-thermometer conversion circuit 314. For example, the dynamic element matching circuit 316 may implement barrel shifting, or other DEM algorithm, to select the bit values of the new thermometer code 321. Because the new thermometer code 321 may include fewer bits than the new thermometer code 220, the dynamic element matching circuit 316 may be less complex than the dynamic element matching circuit 216.

The scrambling and noise shaping circuit 311 controls the thermometer DAC 318 to compensate for quantization in the Out0 signal of delta-sigma modulator circuit 312 relative to its input Res signal. To control the thermometer DAC 318, the scrambling and noise shaping circuit 311 includes a delta-sigma modulator circuit 322, a binary-to-thermometer conversion circuit 324, a dynamic element matching circuit 326, and a first order difference circuit 328. The delta-sigma modulator circuit 322 may be a first-order delta-sigma modulator. The first order difference circuit 328 is coupled to a residue output of the delta-sigma modulator circuit 312, and generates a first order difference signal based on the residue received from the delta-sigma modulator circuit 312. The residue is representative of quantization error in Out0. An input of the delta-sigma modulator circuit 322 is coupled to the output of the first order difference circuit 328. An output of the delta-sigma modulator circuit 322 is coupled to an input of the binary-to-thermometer conversion circuit 324. An output of the binary-to-thermometer conversion circuit 324 is coupled to an input of the dynamic element matching circuit 326. An output of the dynamic element matching circuit 326 is coupled to an input of the thermometer DAC 318. The delta-sigma modulator circuit 322 generates a binary output (Out1) based on the output of the first order difference circuit 328 (and the internal state of the delta-sigma modulator circuit 322). The binary-to-thermometer conversion circuit 324 converts Out1 to a thermometer code. For example, in the output of the binary-to-thermometer conversion circuit 324 a number of bits corresponding to the binary value Out1 are set. The dynamic element matching circuit 326 receives the thermometer code generated by the binary-to-thermometer conversion circuit 324 and generates a new thermometer code 330 for application in the thermometer DAC 318. The new thermometer code 330 selects the same number of control bits for capacitors 320 (includes the same number of set bits) as the thermometer code received from the binary-to-thermometer conversion circuit 324, but the bits set in the new thermometer code 330 may be different from the bits set in the output of the binary-to-thermometer conversion circuit 324. For example, the dynamic element matching circuit 326 may implement barrel shifting, or other DEM algorithm, to select the bit values of the new thermometer code 330.

Figure 4:
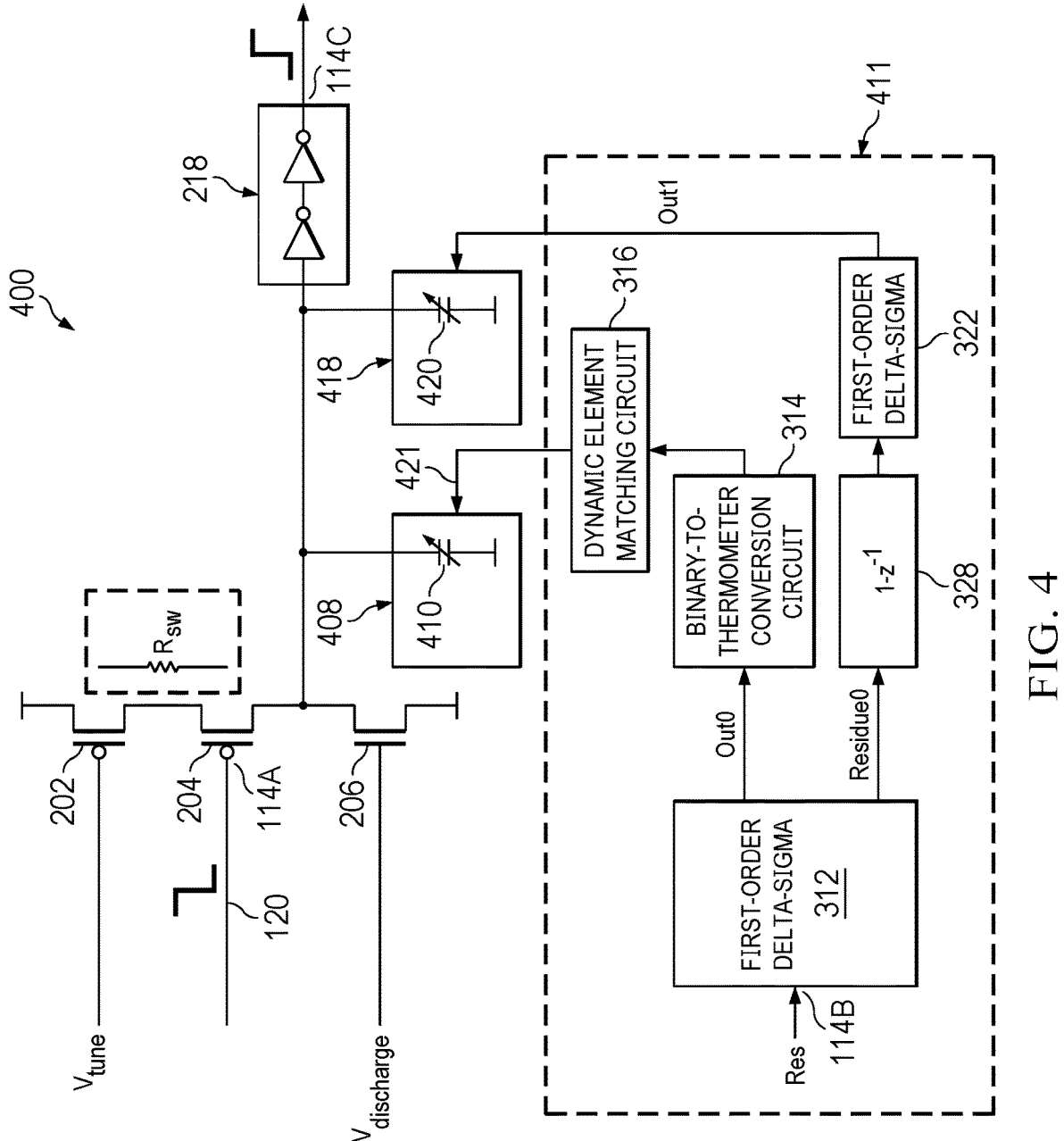
FIG. 4 is a block diagram for a third example digital-to-time converter with reduced mismatch error.

FIG. 4 is a block diagram for an example digital-to-time converter circuit 400 that includes scrambling and noise shaping circuitry to reduce mismatch error. The digital-to-time converter circuit 400 is similar to the digital-to-time converter circuit 300, but includes a binary DAC 418 rather than the thermometer DAC 318. A thermometer DAC 408 includes an array of (N) capacitors 410, and the binary DAC 418 includes an array of (M) binary weighted capacitors 420. Each of the capacitors 420 includes one or more capacitors having a capacitance that is binary weighted relative to a unit capacitance UnitCapacitance. Each capacitor 410 has a capacitance equal to $2^M/2 \ast$UnitCapacitance.

The scrambling and noise shaping circuit 411 selects the particular capacitors 410 and capacitors 420 to be switchably connected to the transistor 204 and the buffer 218 for each edge processed by the digital-to-time converter circuit 400. The scrambling and noise shaping circuit 411 randomizes selection of the capacitors 410 and the capacitors 420 to reduce fractional spurs and, for capacitors 410, shift mismatch related noise to higher frequencies. The scrambling and noise shaping circuit 411 includes the delta-sigma modulator circuit 312, the binary-to-thermometer conversion circuit 314, and the dynamic element matching circuit 316. An output of the delta-sigma modulator circuit 312 is coupled to an input of the binary-to-thermometer conversion circuit 314. An output of the binary-to-thermometer conversion circuit 314 is coupled to an input of the dynamic element matching circuit 316. An output of the dynamic element matching circuit 316 is coupled to an input of the thermometer DAC 408. The delta-sigma modulator circuit 312 generates a binary output (Out0) based on Res (and the internal state of the delta-sigma modulator circuit 312). The binary-to-thermometer conversion circuit 314 converts Out0 to a thermometer code. The dynamic element matching circuit 316 receives the thermometer code generated by the binary-to-thermometer conversion circuit 314 and generates a new thermometer code 421 for application in the thermometer DAC 408. The new thermometer code 421 selects the same number of control bits for capacitors 410 (includes the same number of set bits) as the thermometer code received from the binary-to-thermometer conversion circuit 314, but the bits set in the new thermometer code 421 may be different from the bits set in the output of the binary-to-thermometer conversion circuit 314. For example, the dynamic element matching circuit 316 may implement barrel shifting, or other DEM algorithm, to select the bit values of the new thermometer code 421.

The scrambling and noise shaping circuit 411 controls the binary DAC 418 to compensate for quantization in the delta-sigma modulator circuit 312. To control the binary DAC 418, the scrambling and noise shaping circuit 411 includes the delta-sigma modulator circuit 322 and the first order difference circuit 328. The first order difference circuit 328 is coupled to the residue output of the delta-sigma modulator circuit 312, and generates a first order difference signal based on the residue received from the delta-sigma modulator circuit 312. An input of the delta-sigma modulator circuit 322 is coupled to the output of the first order difference circuit 328. An output of the delta-sigma modulator circuit 322 is coupled to an input of the binary DAC 418. The delta-sigma modulator circuit 322 generates a binary output (Out1) based on the output of the first order difference circuit 328 (and the internal state of the delta-sigma modulator circuit 322). The binary DAC 418 applies Out1 to select the capacitors 420 switchably connected to the transistor 204 and the buffer 218.

The combined influence of delta-sigma modulator circuit 312, first order difference circuit 328, and delta-sigma modulator circuit 322 on binary output Out1 leads to scrambling of the mismatch of the capacitors 420 relative to Res received at the delay input terminal 114B. The binary weighting of the binary DAC 418 provides an efficient control implementation of capacitor selection for capacitors 420 in reducing the impact of quantization noise due to truncation of Out0 relative to Res by delta-sigma modulator circuit 312 which corresponds to quantization error left over from thermometer DAC 408. Mismatch in the binary DAC 418 is not shaped (moved to higher frequencies), but is scrambled, by the combined influence of delta-sigma modulator circuit 312, first order difference circuit 328, and delta-sigma modulator circuit 322, to avoid fractional spurs.

Figure 5:
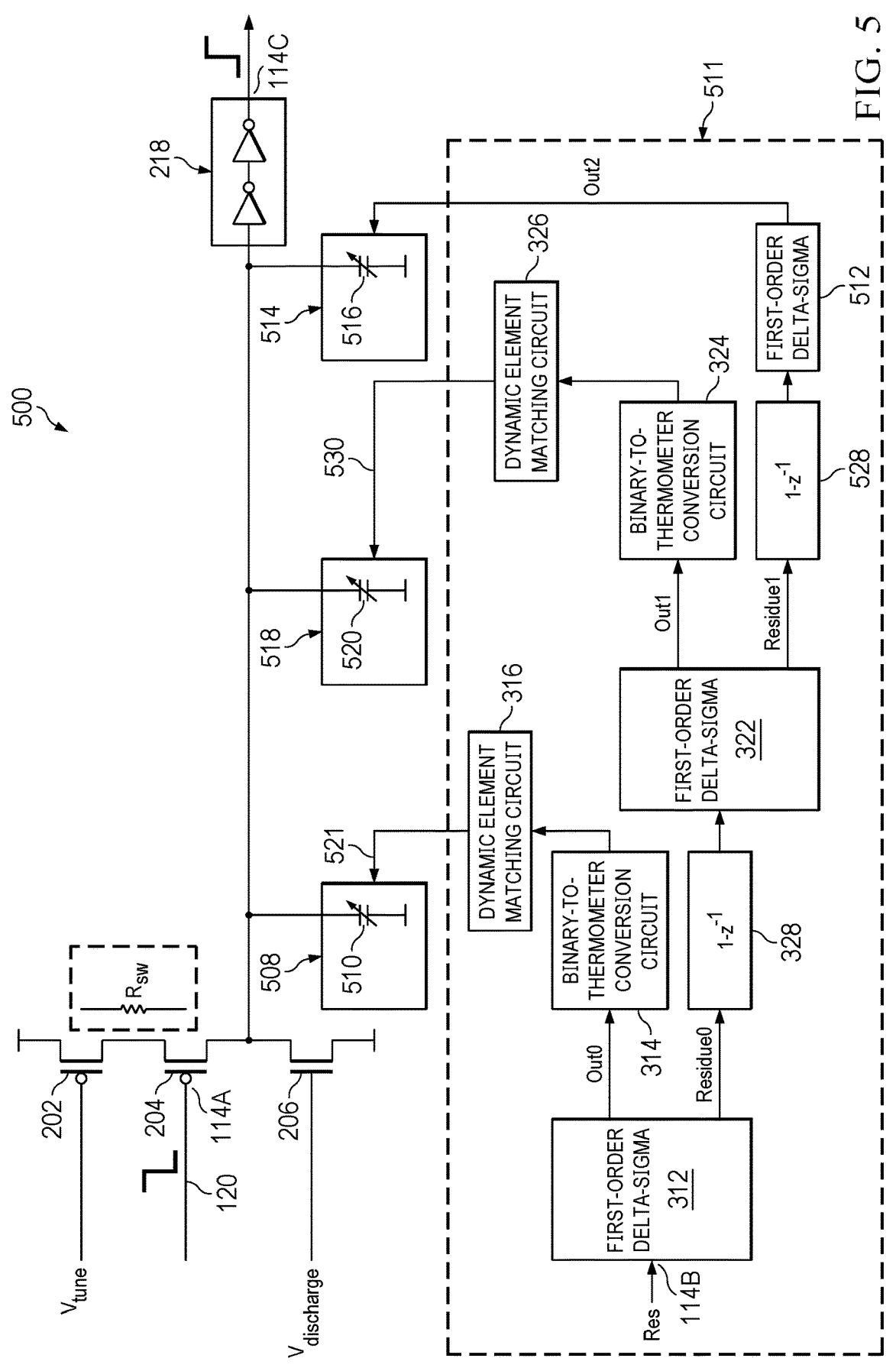
FIG. 5 is a block diagram for a fourth example digital-to-time converter with reduced mismatch error.

FIG. 5 is a block diagram for an example digital-to-time converter circuit 500 that includes scrambling and noise shaping circuitry to reduce mismatch error. The digital-to-time converter circuit 500 is similar to the digital-to-time converter circuit 300, and includes a binary DAC in addition to the two thermometer DACs. The thermometer DAC 508 includes an array of (N) capacitors 510, the thermometer DAC 518 includes an array of (M) capacitors 520, and the binary DAC 514 includes an array of (K) binary weighted capacitors 516. Each of the capacitors 516 includes one or more capacitors having a capacitance that is binary weighted relative to a unit capacitance UnitCapacitance. Each capacitor 520 has a capacitance equal to $$\frac{2^K}{2} * UnitCapacitance.$$

Each capacitor 510 has a capacitance equal to $$\frac{M}{2}\left(\frac{2^K}{2}\right) * UnitCapacitance.$$

The scrambling and noise shaping circuit 511 selects the particular capacitors 510, capacitors 520, and capacitors 516 to be switchably connected to the transistor 204 and the buffer 218 for each edge processed by the digital-to-time converter circuit 500. The scrambling and noise shaping circuit 511 randomizes selection of the capacitors 510, capacitors 520, and capacitors 516 to reduce fractional spurs and shift mismatch related noise to higher frequencies. The scrambling and noise shaping circuit 511 includes the delta-sigma modulator circuit 312, the binary-to-thermometer conversion circuit 314, and the dynamic element matching circuit 316. An output of the delta-sigma modulator circuit 312 is coupled to an input of the binary-to-thermometer conversion circuit 314. An output of the binary-to-thermometer conversion circuit 314 is coupled to an input of the dynamic element matching circuit 316. An output of the dynamic element matching circuit 316 is coupled to an input of the thermometer DAC 508. The delta-sigma modulator circuit 312 generates a binary output (Out0) based on Res (and the internal state of the delta-sigma modulator circuit 312). The binary-to-thermometer conversion circuit 314 converts Out0 to a thermometer code. The dynamic element matching circuit 316 receives the thermometer code generated by the binary-to-thermometer conversion circuit 314 and generates a new thermometer code 521 for application in the thermometer DAC 508. The new thermometer code 521 selects the same number of control bits for capacitors 510 (includes the same number of set bits) as the thermometer code received from the binary-to-thermometer conversion circuit 314, but the bits set in the new thermometer code 521 may be different from the bits set in the output of the binary-to-thermometer conversion circuit 314. For example, the dynamic element matching circuit 316 may implement barrel shifting, or other DEM algorithm, to select the bit values of the new thermometer code 521.

To control the thermometer DAC 518, the scrambling and noise shaping circuit 511 includes the delta-sigma modulator circuit 322, the binary-to-thermometer conversion circuit 324, the dynamic element matching circuit 326, and the first order difference circuit 328. The delta-sigma modulator circuit 322 may be a first-order delta-sigma modulator. The first order difference circuit 328 is coupled to a residue output of the delta-sigma modulator circuit 312, and generates a first order difference signal based on the residue received from the delta-sigma modulator circuit 312. An input of the delta-sigma modulator circuit 322 is coupled to the output of the first order difference circuit 328. An output of the delta-sigma modulator circuit 322 is coupled to an input of the binary-to-thermometer conversion circuit 324. An output of the binary-to-thermometer conversion circuit 324 is coupled to an input of the dynamic element matching circuit 326. An output of the dynamic element matching circuit 326 is coupled to an input of the thermometer DAC 518. The delta-sigma modulator circuit 322 generates a binary output (Out1) based on the output of the first order difference circuit 328 (and the internal state of the delta-sigma modulator circuit 322). The binary-to-thermometer conversion circuit 324 converts Out1 to a thermometer code. For example, in the output of the binary-to-thermometer conversion circuit 324, a number of bits corresponding to the binary value Out1 are set. The dynamic element matching circuit 326 receives the thermometer code generated by the binary-to-thermometer conversion circuit 324 and generates a new thermometer code 530 for application in the thermometer DAC 518. The new thermometer code 530 selects the same number of control bits for capacitors 520 (includes the same number of set bits) as the thermometer code received from the binary-to-thermometer conversion circuit 324, but the bits set in the new thermometer code 530 may be different from the bits set in the output of the binary-to-thermometer conversion circuit 324. For example, the dynamic element matching circuit 326 may implement barrel shifting, or other DEM algorithm, to select the bit values of the new thermometer code 530.

To control the binary DAC 514, the scrambling and noise shaping circuit 511 includes the delta-sigma modulator 512 and the first order difference circuit 528. The first order difference circuit 528 is coupled to the residue output of the delta-sigma modulator circuit 322, and generates a first order difference signal based on the residue received from the delta-sigma modulator circuit 322. An input of the delta-sigma modulator 512 is coupled to the output of the first order difference circuit 528. An output of the delta-sigma modulator 512 is coupled to an input of the binary DAC 514. The delta-sigma modulator 512 generates a binary output (Out2) based on the output of the first order difference circuit 528 (and the internal state of the delta-sigma modulator 512). The binary DAC 514 applies Out2 to select the capacitors 516 switchably connected to the transistor 204 and the buffer 218.

Relative to the digital-to-time converter circuit 400, the digital-to-time converter circuit 500 provides a higher number of thermometer segments without requiring unduly complex dynamic element matching circuitry. The higher number of thermometer segments allows for increased noise shaping of mismatch relative to the digital-to-time converter circuit 400, which pushes more quantization noise to higher frequencies for filtering by the PLL. Relative to the digital-to-time converter circuit 300, the digital-to-time converter circuit 500 provides additional reduction of quantization noise by inclusion of the binary DAC 514. Mismatch in the binary DAC 514 is not shaped (moved to higher frequencies), but is scrambled, by the combined influence of delta-sigma modulator circuit 312 and first order difference circuit 328 and delta-sigma modulator circuit 322 and first order difference circuit 528 and delta-sigma modulator 512, to avoid fractional spurs.

Figure 6:
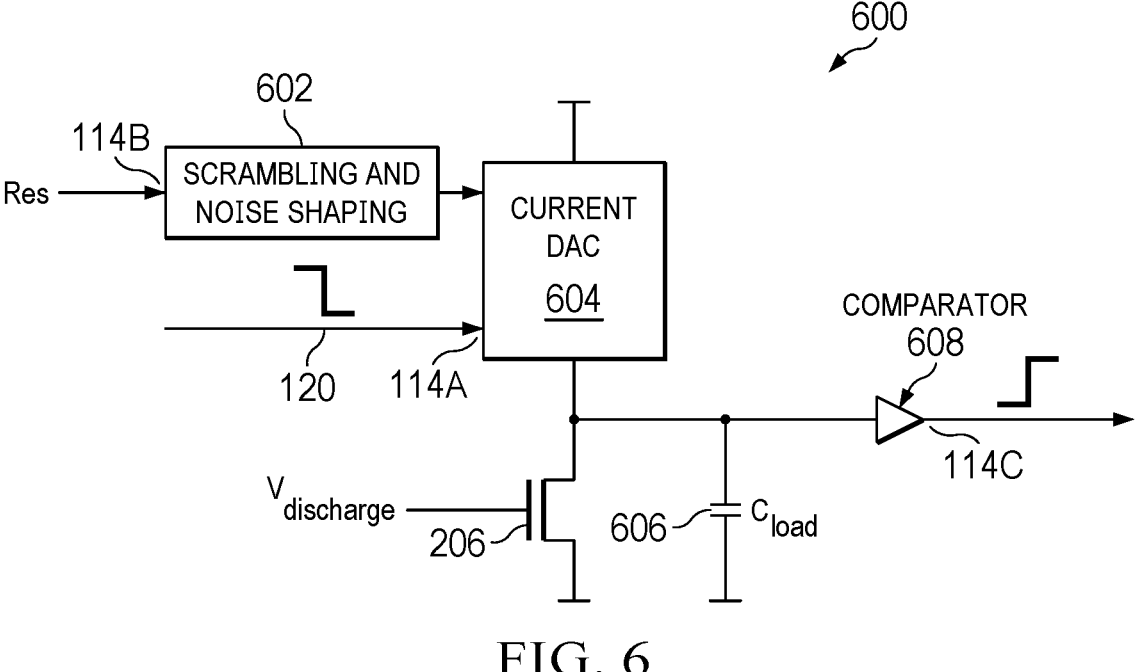
FIG. 6 is a block diagram for an example digital-to-time converter with reduced mismatch error that includes a current-based digital-to-analog converter.

FIG. 6 is a block diagram for an example digital-to-time converter circuit 600 with reduced impact of mismatch error that includes a current DAC 604. The digital-to-time converter circuit 600 may be similar to the digital-to-time converter circuit 200, the digital-to-time converter circuit 300, the digital-to-time converter circuit 400, or the digital-to-time converter circuit 500, but uses the current DAC 604 rather than a capacitive DAC. The current DAC 604 may be segmented into one or more thermometer current DACs and/or a binary current DAC that replace the capacitive DACs of the digital-to-time converter circuit 200, the digital-to-time converter circuit 300, the digital-to-time converter circuit 400, or the digital-to-time converter circuit 500. The current DAC 604 charges a capacitor 606 to provide a selected delay of an edge of the signal 120. The transistor 206 discharges the capacitor 606. The comparator 608 is an implementation of the buffer 218.

The scrambling and noise shaping circuit 602 selects the current sources of the current DAC 604 to charge the capacitor 606. The scrambling and noise shaping circuit 602 may be an implementation of the scrambling and noise shaping circuit 211, the scrambling and noise shaping circuit 311, the scrambling and noise shaping circuit 411, or the scrambling and noise shaping circuit 511 in accordance with the arrangement of the current DAC 604. For example, if the current DAC 604 includes a single thermometer current DAC, then the scrambling and noise shaping circuit 602 may be an implementation of the scrambling and noise shaping circuit 211. If the current DAC 604 includes two thermometer current DACs, then the scrambling and noise shaping circuit 602 may be an implementation of the scrambling and noise shaping circuit 311. If the current DAC 604 includes one thermometer current DAC and a binary current DAC, then the scrambling and noise shaping circuit 602 may be an implementation of the scrambling and noise shaping circuit 411. If the current DAC 604 includes two thermometer current DACs and a binary current DAC, then the scrambling and noise shaping circuit 602 may be an implementation of the scrambling and noise shaping circuit 511.

Figure 7:
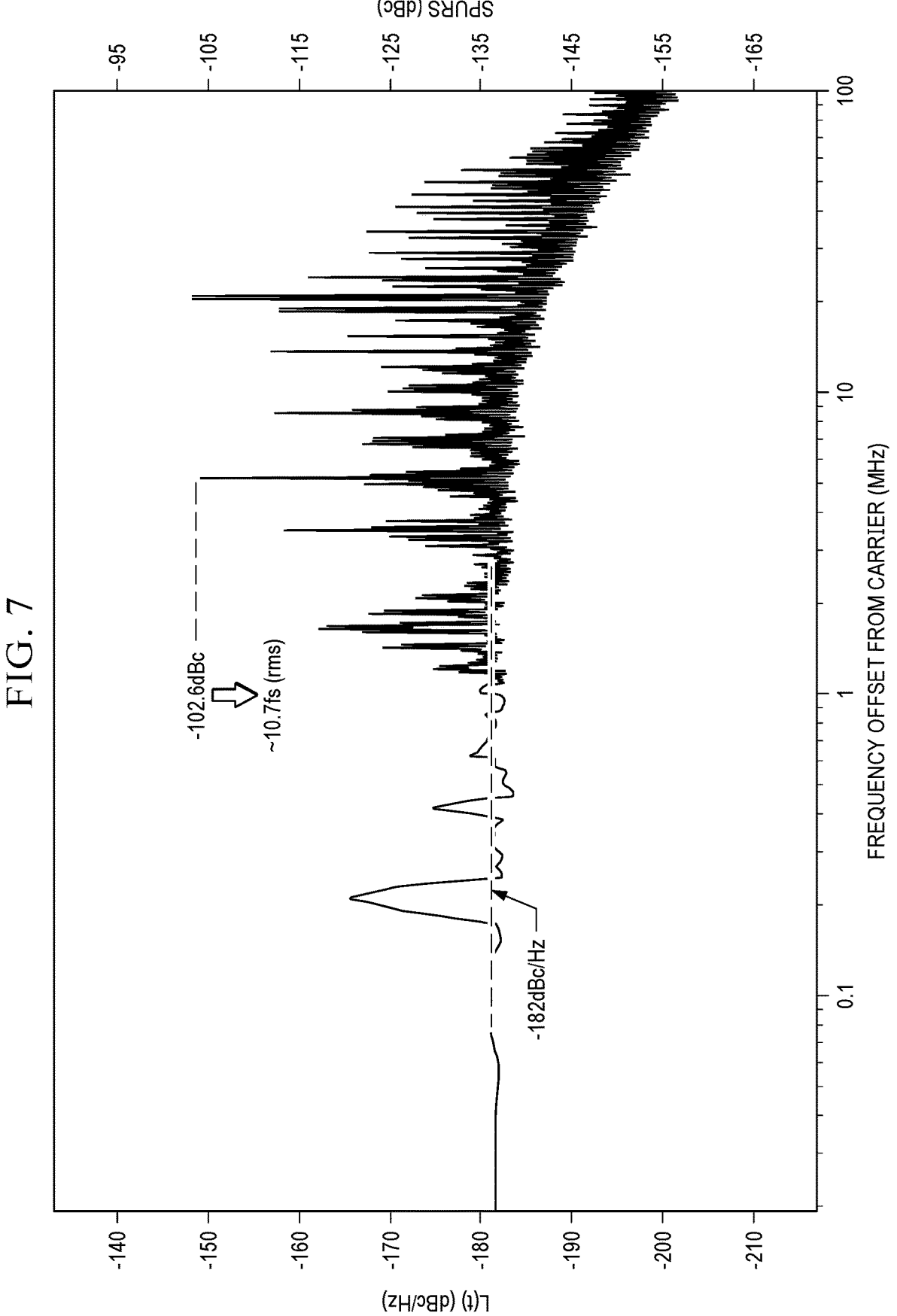
FIG. 7 is a graph showing phase noise in a simulation of the fractional-N synthesizer of FIG. 1A.

FIG. 7 is a graph showing phase noise at 156 MHz carrier frequency from a simulation of a fractional-N synthesizer of FIG. 1A that utilizes the digital-to-time converter circuit 114, where the digital-to-time converter circuit 114 is an implementation of the digital-to-time converter circuit 500 with unit cap mismatch having standard deviation of 50 percent relative to a nominal cap value. Note that unit cap mismatch with 50 percent standard deviation may be considered quite large relative to most practical implementations. FIG. 7 shows that spur level for the largest two spurs is about −102.6 dBc, and the root-mean-squared (RMS) jitter for the largest two spurs is about 10.7 femto-seconds. Given that state of the art jitter in modern fractional-N synthesizers is >30 fs, this simulation example indicates that jitter due to digital-to-time converter mismatch may be non-dominant relative to overall synthesizer jitter when applying the described scrambling and noise shaping techniques to the digital-to-time converter implementation.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

While the use of particular transistors is described herein, other transistors (or equivalent devices) may be used instead. For example, a p-channel field effect transistor ("PFET") may be used in place of an n-channel field effect transistor ("NFET") with little or no changes to the circuit. Furthermore, other types of transistors may be used (such as bipolar junction transistors (BJTs)).

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include additional or different components to provide functionality at least partially similar to functionality available prior to the component replacement. Components shown as transistors, unless otherwise stated, are generally representative of any one or more transistors coupled in parallel to provide desired channel width or emitter size.

Modifications are possible in the described embodiments, and other embodiments are possible, within the scope of the claims.

What is claimed is:

1. A circuit, comprising:
   a variable delay circuit having a clock input, first delay control inputs, second delay control inputs, and a clock output;
   a code scrambler circuit having a code input and outputs, the outputs coupled to the first delay control inputs; and
   a delta-sigma modulator having a modulator output and a residue output, the modulator output coupled to the code input, and the residue output coupled to the second delay control inputs.

2. The circuit of claim 1, wherein the code scrambler circuit is a first code scrambler circuit, the code input is first code input, and the outputs are first outputs, and the first outputs are coupled to the first delay control inputs; and
   wherein the circuit includes a second code scrambler circuit having a second code input and second outputs, the second outputs coupled to the second delay control inputs, and the second code input coupled to the residue output.

3. The circuit of claim 2, wherein the first code scrambler circuit includes or is part of a dynamic element matching (DEM) circuit coupled between the modulator output and the first delay control inputs.

4. The circuit of claim 3, wherein:
the DEM is a first DEM; and
the second code scrambler circuit includes or is part of a second DEM coupled between the residue output and the second delay control inputs.

5. The circuit of claim 4, wherein:
the delta-sigma modulator is a first delta-sigma modulator having a first modulator input, a first modulator output, and a first residue output;
the circuit includes a second delta-sigma modulator having a second modulator input, a second modulator output, and a second residue output, the second modulator input coupled to the first residue output, and the second modulator output coupled to the second code input;
the variable delay circuit has third delay control inputs and includes a third set of delay control elements having third control inputs; and
the circuit includes a third code scrambler circuit having a third code input and third outputs, the third code input coupled to the second residue output, and the third outputs coupled to the third delay control inputs.

6. The circuit of claim 5, further comprising a third delta-sigma modulator coupled between the second residue output and the third delay control inputs.

7. The circuit of claim 2, wherein the variable delay circuit includes:
a first set of delay control elements having first control inputs coupled to the first delay control inputs and including at least one of a first set of segmented capacitors or a first set of segmented current sources; and
a second set of delay control elements having second control inputs coupled to the second delay control inputs and including at least one of a second set of segmented capacitors or a second set of segmented current sources.

8. The circuit of claim 7, wherein:
each of the first and second sets of segmented capacitors includes at least one of: a respective first set of binary segmented capacitors, or a respective second set of thermometer segmented capacitors; and
each of the first and second sets of segmented current sources includes at least one of: a respective first set of binary segmented current sources, or a respective second set of thermometer segmented current sources.

9. A circuit, comprising:
a variable delay circuit having a clock input, first delay control inputs, second delay control inputs, and a clock output, the variable delay circuit including a first set of delay control elements having first control inputs coupled to the first delay control inputs and a second set of delay control elements having second control inputs coupled to the second delay control inputs; and
a sigma-delta modulator having a modulator output and a residue output, the modulator output coupled to the first delay control inputs, and the residue output coupled to the second delay control inputs.

10. The circuit of claim 9, further comprising a dynamic element matching (DEM) circuit coupled between the modulator output and the first delay control inputs.

11. The circuit of claim 10, wherein:
the DEM is a first DEM; and
the circuit includes a second DEM coupled between the residue output and the second delay control inputs.

12. The circuit of claim 11, wherein:
the variable delay circuit has third delay control inputs and includes a third set of delay control elements having control inputs coupled to the third delay control inputs; and
the circuit includes a delay control circuit having an input and an output, the input of the delay control circuit coupled to the residue output, and the output of the delay control circuit coupled to the third delay control inputs.

13. The circuit of claim 9, wherein:
the first set of delay control elements includes at least one of a first set of segmented capacitors or a first set of segmented current sources; and
the second set of delay control elements includes at least one of a second set of segmented capacitors or a second set of segmented current sources.

14. The circuit of claim 13, wherein:
each of the first and second sets of segmented capacitors includes at least one of: a respective first set of binary segmented capacitors, or a respective second set of thermometer segmented capacitors; and
each of the first and second sets of segmented current sources includes at least one of: a respective first set of binary segmented current sources, or a respective second set of thermometer segmented current sources.

15. The circuit of claim 9, wherein the variable delay circuit includes or is part of a digital to time converter.

16. A circuit, comprising:
a phase detector circuit;
a filter circuit;
a voltage-controlled oscillator (VCO) coupled to the phase detector circuit via the filter circuit;
a divider circuit coupled to the VCO;
a delta-sigma modulator coupled to the divider circuit;
a variable delay circuit having a clock input, first delay control inputs, second delay control inputs, and a clock output; and
a code scrambler circuit having a code input and outputs, the outputs coupled to the first delay control inputs, the code input coupled to a modulator output of the delta-sigma modulator, and a residue output of the delta-sigma modulator coupled to the second delay control inputs.

17. The circuit of claim 16, wherein:
the code scrambler circuit is a first code scrambler circuit, the code input is first code input, and the outputs are first outputs, and the first outputs are coupled to the first delay control inputs; and
the circuit includes a second code scrambler circuit having a second code input and second outputs, the second outputs coupled to the second delay control inputs, and the second code input coupled to the residue output.

18. The circuit of claim 17, wherein the first code scrambler circuit includes or is part of a dynamic element matching (DEM) circuit coupled between the modulator output and the first delay control inputs.

19. The circuit of claim 18, wherein:
the DEM is a first DEM; and the second code scrambler circuit includes a second DEM coupled between the residue output and the second delay control inputs.

20. The circuit of claim 19, wherein:

the delta-sigma modulator is a first delta-sigma modulator having a first modulator input, a first modulator output, and a first residue output;

the circuit includes a second delta-sigma modulator having a second modulator input, a second modulator output, and a second residue output, the second modulator input coupled to the first residue output, and the second modulator output coupled to the second code input;

the variable delay circuit has third delay control inputs and includes a third set of delay control elements having third control inputs; and the circuit includes a third code scrambler circuit having a third code input and third outputs, the third code input coupled to the second residue output, and the third outputs coupled to the third delay control inputs.

21. The circuit of claim 20, further comprising a third delta-sigma modulator coupled between the second residue output and the third delay control inputs.

22. The circuit of claim 16, wherein the variable delay circuit includes or is part of a digital to time converter circuit.

23. The circuit of claim 7, wherein the first set of delay control elements are thermometer segmented.

24. The circuit of claim 7, wherein the first and second sets of delay control elements are thermometer segmented.

25. The circuit of claim 5, wherein the first and second sets of delay control elements are thermometer segmented, and the third set of delay control elements are binary segmented.

26. The circuit of claim 16, wherein the clock input of the variable delay circuit is coupled to an output of the divider circuit, and the clock output of the variable delay circuit is coupled to an input of the phase detector circuit.

27. The circuit of claim 26, wherein the variable delay circuit is a first variable delay circuit having a first clock input, the first and second delay control inputs, and a first clock output;

wherein the input of the phase detector circuit is a first input, and the phase detector circuit has a second input; and wherein the circuit further comprises a second variable delay circuit having a second clock input, third delay control inputs, and a second clock output, the second clock output coupled to the second input of the phase detector circuit, and the second delay control inputs coupled to the third delay control inputs.

28. The circuit of claim 16, wherein a first input of the phase detector circuit is coupled to an output of the divider circuit, and a second input of the phase detector circuit is coupled to the clock output of the variable delay circuit.

29. The circuit of claim 2, wherein the delta-sigma modulator is a first delta-sigma modulator, the modulator output is a first modulator output, and the residue output is a first residue output; and wherein the circuit includes a second delta-sigma modulator having a modulator input, a second modulator output, and a second residue output, the modulator input coupled to the first residue output, and the second modulator output coupled to the second code input.

30. The circuit of claim 17, wherein the delta-sigma modulator is a first delta-sigma modulator, the modulator output is a first modulator output, and the residue output is a first residue output; and wherein the circuit includes a second delta-sigma modulator having a modulator input, a second modulator output, and a second residue output, the modulator input coupled to the first residue output, and the second modulator output coupled to the second code input.

* * * * *